(12) United States Patent
Jeong et al.

(10) Patent No.: US 11,636,910 B2
(45) Date of Patent: Apr. 25, 2023

(54) APPARATUS CONFIGURED TO PERFORM A TEST OPERATION

(71) Applicant: SK hynix Inc., Icheon-si (KR)

(72) Inventors: Hyeong Soo Jeong, Icheon-si (KR); Dong Beom Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/306,603

(22) Filed: May 3, 2021

(65) Prior Publication Data

US 2022/0254427 A1 Aug. 11, 2022

(30) Foreign Application Priority Data

Feb. 9, 2021 (KR) .................. 10-2021-0018665

(51) Int. Cl.
*G11C 29/36* (2006.01)
*G11C 29/46* (2006.01)
*G11C 29/44* (2006.01)
*G11C 7/10* (2006.01)

(52) U.S. Cl.
CPC .............. *G11C 29/36* (2013.01); *G11C 7/106* (2013.01); *G11C 7/1063* (2013.01); *G11C 7/1087* (2013.01); *G11C 29/44* (2013.01); *G11C 29/46* (2013.01); *G11C 2029/3602* (2013.01)

(58) Field of Classification Search
CPC ....... G11C 7/106; G11C 7/1063; G11C 7/1087; G11C 29/44; G11C 29/46; G11C 2029/3602
See application file for complete search history.

(56) References Cited

U.S. PATENT DOCUMENTS

| | | | | |
|---|---|---|---|---|
| 6,975,238 B2 * | 12/2005 | Schneider | ........... | G06F 11/1008 714/10 |
| 8,289,070 B2 * | 10/2012 | Huang | ................. | G11C 29/027 327/525 |
| 8,730,744 B2 * | 5/2014 | Kawakubo | ........... | G11C 29/785 365/201 |
| 9,293,227 B1 * | 3/2016 | Takasugi | ................ | G11C 29/76 |
| 9,564,247 B2 * | 2/2017 | Shim | ..................... | G11C 29/78 |

FOREIGN PATENT DOCUMENTS

| KR | 1020190047860 A | 5/2019 |
|---|---|---|
| KR | 102077072 B1 | 2/2020 |

* cited by examiner

*Primary Examiner* — Vanthu T Nguyen
(74) *Attorney, Agent, or Firm* — William Park & Associates Ltd.

(57) ABSTRACT

An apparatus includes a selection data generation circuit configured to generate selection data from fuse data or generate the selection data having a preset test input pattern, depending on whether a failure test is entered; and a failure flag generation circuit configured to generate latch data by latching the selection data, and generate a failure flag by detecting whether the latch data has a preset test pattern.

13 Claims, 15 Drawing Sheets

APPARATUS CONFIGURED TO PERFORM A TEST OPERATION

CROSS-REFERENCE TO RELATED APPLICATION

The present application claims priority under 35 U.S.C. § 119(a) to Korean Patent Application No. 10-2021-0018665 filed on Feb. 9, 2021 in the Korean Intellectual Property Office, which is incorporated herein by reference in its entirety.

BACKGROUND

1. Technical Field

Embodiments of the disclosure may generally relate to an apparatus, and more particularly, to an apparatus configured to perform a test operation.

2. Related Art

An electronic device may include an array rupture e-fuse (ARE) in which informations are programmed to a plurality of e-fuses. The electronic device may store informations outputted from the ARE and perform various internal operations using the stored informations.

SUMMARY

In an embodiment, an apparatus may include: a selection data generation circuit configured to generate selection data from fuse data or generate the selection data having a preset test input pattern, depending on whether a failure test is entered; and a failure flag generation circuit configured to generate latch data by latching the selection data, and generate a failure flag by detecting whether the latch data has a preset test pattern.

In an embodiment, an apparatus may include: a selection data generation circuit configured to generate selection data from pattern data having one of first and second test input patterns when a failure test is entered; and a failure flag generation circuit configured to generate latch data by latching the selection data, and generate a failure flag by detecting whether the latch data has a preset test pattern.

In an embodiment, an apparatus may include: a first internal failure flag generation circuit configured to generate first latch data by latching first selection data, and generate a first internal failure flag by detecting whether the first latch data has a preset test pattern; a second internal failure flag generation circuit configured to generate second latch data by latching second selection data, and generate a second internal failure flag by detecting whether the second latch data has the preset test pattern; and a failure flag output circuit configured to output one of the first and second internal failure flags as a failure flag based on first and second test control signals.

In an embodiment, an apparatus may include: a fuse data storage circuit configured to store fuse data; a selection data generation circuit configured to generate selection data from one of fuse data and pattern data having a preset test input pattern, depending on whether a failure test is entered; and a failure flag generation circuit configured to detect whether the fuse data storage circuit is defective by detecting whether the selection data has a preset test pattern.

DETAILED DESCRIPTION

In the description of the following embodiments, the term "preset" means that the numerical value of a parameter is determined in advance when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the one component may be coupled or connected to the another component directly or by the medium of still another component. On the other hand, the descriptions of "directly coupled" or "directly connected" should be understood to mean that one component is coupled or connected to another component directly without intervention of a still another component.

"Logic high level" and "logic low level" are used to describe logic levels of signals, A signal having a "logic high level" is distinguished from a signal having a "logic low level," For example, when a signal having a first voltage corresponds to a signal having a "logic high level," a signal having a second voltage may correspond to a signal having a "logic low level," Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal having a logic high level may be set to have a logic low level, and a signal having a logic low level may be set to have a logic high level.

Hereinafter, various examples of embodiments of the disclosure will be described with reference to the accompanying drawings. These embodiments are only for illustrating the disclosure, and the scope of protection of the disclosure is not limited by these embodiments.

Various embodiments are directed to an apparatus performing a test operation.

According to the present disclosure, when a failure test is performed, by applying and storing pattern data having a test input pattern to and in a latch circuit for fuse data and by detecting whether some pattern data of the stored pattern data has a preset pattern, it may be possible to detect whether the latch circuit for fuse data is defective and a location of a defect.

Figure 1:
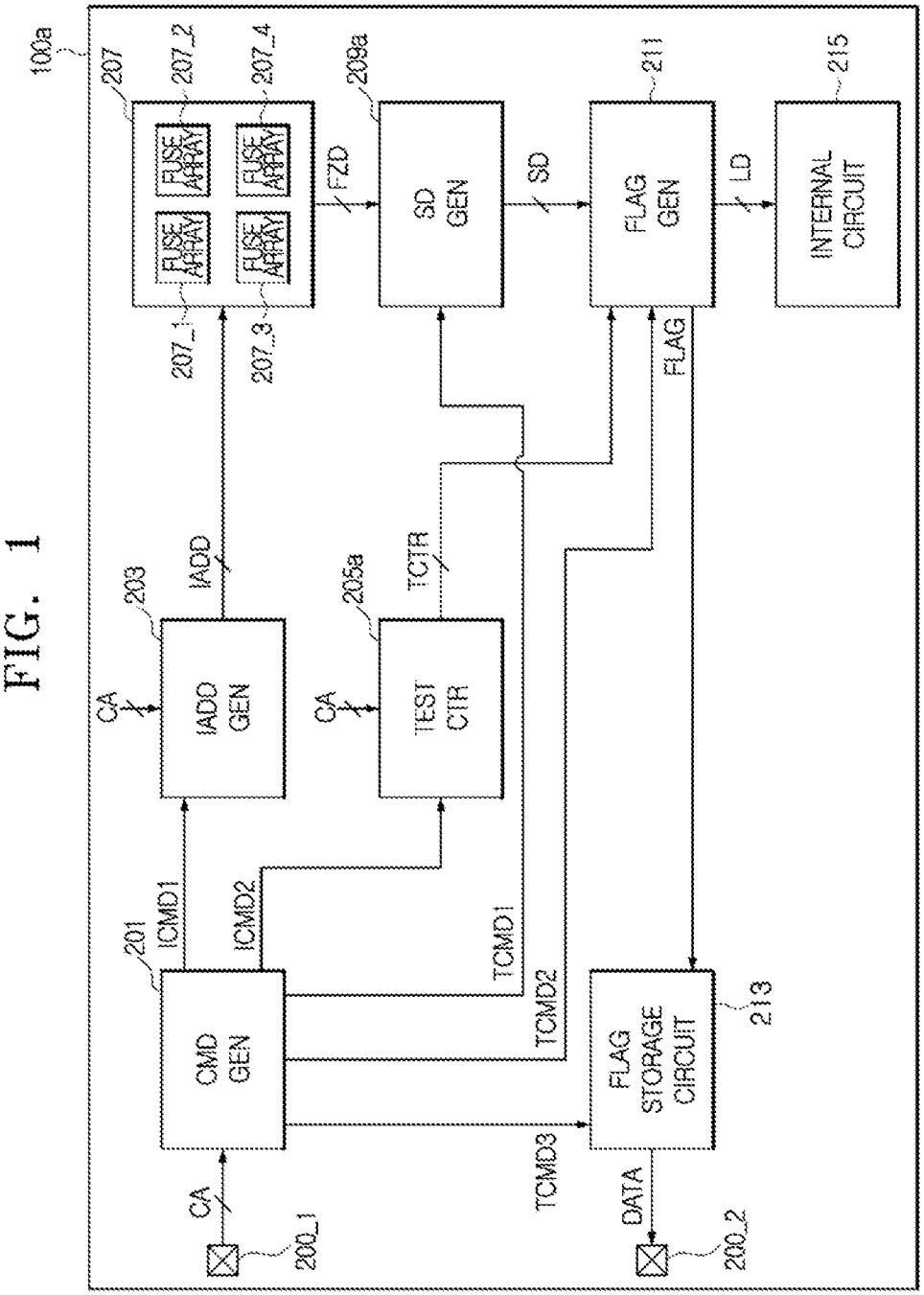
FIG. 1 is a block diagram illustrating a configuration of an apparatus in accordance with an embodiment of the present disclosure.

FIG. 1 is a block diagram illustrating a configuration of an apparatus 100a in accordance with an embodiment of the present disclosure. As illustrated in FIG. 1, the apparatus 100a may include a first pad 200_1, a second pad 200_2, a command generation circuit (CMD GEN) 201, an address generation circuit (IADD GEN) 203, a test control circuit (TEST CTR) 205a, a fuse data storage circuit 207, a selection data generation circuit (SD GEN) 209a, a failure flag generation circuit (FLAG GEN) 211, a failure flag storage circuit (FLAG STORAGE CIRCUIT) 213 and an internal circuit (INTERNAL CIRCUIT) 215.

The apparatus 100a may receive an external setting code CA through the first pad 200_1 from a controller (1200 of FIG. 15), The number of bits of the external setting code CA may be variously set depending on an embodiment. The apparatus 100a may perform various internal operations, such as a boot-up operation, a mode register write operation and a failure test, by receiving the external setting code CA. The apparatus 100a may transmit and receive data DATA to and from the controller (1200 of FIG. 15) through the second pad 200_2. The number of bits of the data DATA may be variously set depending on an embodiment.

The command generation circuit 201 may generate a first internal command ICMD1, a second internal command ICMD2, a first test command TCMD1, a second test command TCMD2 and a third test command TCMD3 based on the external setting code CA. The command generation circuit 201 may activate the first internal command ICMD1 based on the external setting code CA which has a logic level combination for performing the boot-up operation. The command generation circuit 201 may activate the second internal command ICMD2 based on the external setting code CA which has a logic level combination for performing the mode register write operation. The command generation circuit 201 may activate the first test command TCMD1 based on the external setting code CA which has a logic level combination for entering the failure test. The command generation circuit 201 may activate the second test command TCMD2 based on the external setting code CA which has a logic level combination for performing the failure test. The command generation circuit 201 may activate the third test command TCMD3 based on the external setting code CA which has a logic level combination for outputting a failure flag FLAG stored in the failure flag storage circuit 213.

The address generation circuit 203 may generate an internal address IADD from the external setting code CA based on the first internal command ICMD1. The address generation circuit 203 may generate the internal address IADD by extracting the external setting code CA when the first internal command ICMD1 is activated. The number of bits of the internal address IADD may be variously set depending on an embodiment.

The test control circuit 205a may generate a test control signal TCTR from the external setting code CA based on the second internal command ICMD2. When the second internal command ICMD2 is activated, the test control circuit 205a may selectively activate the test control signal TCTR depending on a combination of the external setting code CA, For example, when the second internal command ICMD2 is activated, the test control circuit 205a may activate a first test control signal TCTR<1> (see FIG. 2) corresponding to a first combination of the external setting code CA. When the second internal command ICMD2 is activated, the test control circuit 205a may activate a second test control signal TCTR<2> (see FIG. 2) corresponding to a second combination of the external setting code CA. The test control signal TCTR may be generated to control the output of the failure flag FLAG in the failure flag generation circuit 211. For example, the first test control signal TCTR<1> (see FIG. 2) may be activated to output a first internal failure flag IFLAG1 (see FIG. 2) as the failure flag FLAG (see FIG. 2). The second test control signal TCTR<2> (see FIG. 2) may be activated to output a second internal failure flag IFLAG2 (see FIG. 2) as the failure flag FLAG (see FIG. 2).

The fuse data storage circuit 207 may include a plurality of fuse arrays (FUSE ARRAY) 207_1, 207_2, 207_3 and 207_4. The fuse data storage circuit 207 may be implemented by an array rupture e-fuse (ARE) circuit. The fuse data storage circuit 207 may store fuse data FZD in the plurality of fuse arrays 207_1, 207_2, 207_3 and 207_4, For example, the fuse data storage circuit 207 may store first fuse data FZD_1 in the first fuse array 207_1. The fuse data storage circuit 207 may store second fuse data FZD_2 in the second fuse array 207_2. The fuse data storage circuit 207 may output the fuse data FZD, stored in the plurality of fuse arrays 207_1, 207_2, 207_3 and 207_4, by decoding the internal address IADD. Each of the plurality of fuse arrays 207_1, 207_2, 207_3 and 207_4 may correspond to each combination of the internal addresses IADD, For example, the first fuse array 207_1 may correspond to a first combination of internal addresses IADD. The second fuse array 207_2 may correspond to a second combination of the internal addresses IADD. The fuse data storage circuit 207 may output the first fuse data FZD_1, stored in the first fuse array 207_1, by decoding the internal address IADD having the first combination. The fuse data storage circuit 207 may output the second fuse data FZD_2, stored in the second fuse array 207_2, by decoding the internal address IADD having the second combination.

The selection data generation circuit 209a may generate selection data SD based on the first test command TCMD1 and the fuse data FZD, The selection data generation circuit 209a may generate the selection data SD from the fuse data FZD or generate the selection data SD having a preset test input pattern, depending on whether the failure test is entered. The selection data generation circuit 209a may store therein pattern data (not illustrated) having the preset test input pattern. The preset test input pattern may be set as bits which are the same as bits of a test pattern preset in the failure flag generation circuit 211. For example, the preset test input pattern may be set as 'L, L, L, L' when the preset test pattern is set as 'L, L, L, L.' The selection data generation circuit 209a may output one of the fuse data FZD and the pattern data, stored therein, as the selection data SD depending on whether the failure test is entered. When the first test command TCMD1 is inactivated, the selection data generation circuit 209a may output the fuse data FZD as the selection data SD. For example, when the first test command TCMD1 is inactivated, the selection data generation circuit 209a may output the first fuse data FZD_1 as first selection data SD_1. When the first test command TCMD1 is inactivated, the selection data generation circuit 209a may output the second fuse data FZD_2 as second selection data SD_2. When the failure test is entered based on the activated first test command TCMD1, the selection data generation circuit 209a may output the stored pattern data as the selection data SD. For example, when the failure test is entered, the selection data generation circuit 209a may output the first selection data SD_1 and the second selection data SD_2, having the preset test input pattern, from the stored pattern data.

The failure flag generation circuit 211 may generate latch data LD and the failure flag FLAG from the selection data SD based on the second test command TCMD2 and the test control signal TCTR, The failure flag generation circuit 211 may generate the latch data LD by latching the selection data SD. For example, the failure flag generation circuit 211 may generate first latch data LD_1 (see FIG. 2) by latching the first selection data SD_1 (see FIG. 2). The failure flag generation circuit 211 may generate second latch data LD_2 (see FIG. 2) by latching the second selection data SD_2 (see FIG. 2). The failure flag generation circuit 211 may generate the failure flag FLAG by detecting whether the latch data LD has the preset test pattern, based on the second test command TCMD2 and the test control signal TCTR, When the failure test is performed, the failure flag generation circuit 211 may generate the failure flag FLAG by detecting whether the latch data LD has the preset test pattern, based on the test control signal TCTR. For example, when the failure test is performed, the failure flag generation circuit 211 may generate the failure flag FLAG (see FIG. 2) by detecting whether the first latch data LD_1 (see FIG. 2) has the preset test pattern, based on the activated first test control signal TCTR<1> (see FIG. 2). When the failure test is performed, the failure flag generation circuit 211 may generate the failure flag FLAG (see FIG. 2) by detecting whether the second latch data LD_2 (see FIG. 2) has the preset test pattern, based on the activated second test control signal TCTR<2> (see FIG. 2). Accordingly, when the failure test is entered, the failure flag generation circuit 211 may generate the latch data LD by latching the selection data SD having the test input pattern, and may detect whether some of the latch data LD has the preset test pattern, thereby detecting whether a latch circuit for fuse data is defective and a location of a defect. The configuration and operation of the failure flag generation circuit 211 will be described later with reference to FIG. 2.

The failure flag storage circuit 213 may generate data DATA based on the third test command TCMD3 and the failure flag FLAG. The failure flag storage circuit 213 may receive the failure flag FLAG and store the received failure flag FLAG as the data DATA. When the third test command TCMD3 is activated, the failure flag storage circuit 213 may output the stored data DATA to the second pad 200_2 through a data output line.

The internal circuit 215 may perform various internal operations based on the latch data LD.

Figure 2:
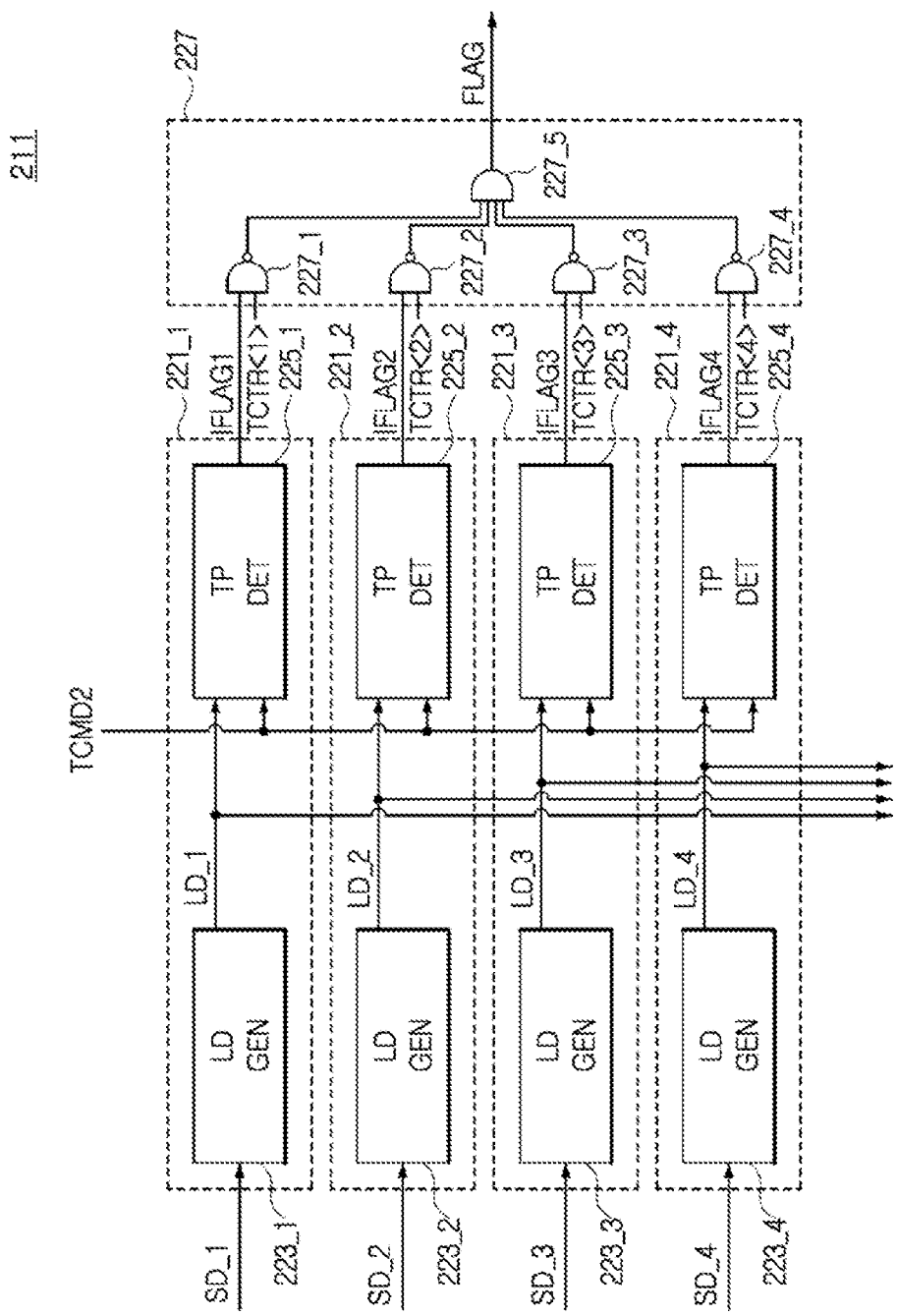
FIG. 2 is a diagram illustrating an embodiment of a failure flag generation circuit illustrated in FIG. 1.

FIG. 2 is a diagram illustrating an embodiment of the failure flag generation circuit 211 illustrated in FIG. 1. As illustrated in FIG. 2, the failure flag generation circuit 211 may include a plurality of internal failure flag generation circuits 221_1, 221_2, 221_3 and 221_4 and a failure flag output circuit 227.

The first internal failure flag generation circuit 221_1 may include a first latch data generation circuit (LD GEN) 223_1 and a first test pattern detection circuit (TP DET) 225_1. The first internal failure flag generation circuit 221_1 may generate the first latch data LD_1 by latching the first selection data SD_1. When the failure test is performed based on the second test command TCMD2, the first internal failure flag generation circuit 221_1 may generate the first internal failure flag IFLAG1 by detecting whether the first latch data LD_1 has the preset test pattern. The preset test pattern may be variously set depending on an embodiment. For example, the preset test pattern may be set as a logic level combination 'L, L, L, L.' Since the operation of each of the second, third and fourth internal failure flag generation circuits 221_2, 221_3 and 221_4 is implemented in the same manner as the operation of the first internal failure flag generation circuit 221_1, detailed description thereof will be omitted herein. Accordingly, when the failure test is performed, the internal failure flag generation circuits 221_1, 221_2, 221_3 and 221_4 may generate the latch data LD by latching the selection data SD having the test input pattern, and may detect whether the latch data LD has the preset test pattern, thereby detecting whether a latch circuit for fuse data is defective.

The first latch data generation circuit 223_1 may generate the first latch data LD_1 by latching the first selection data SD_1, The configuration and operation of the first latch data generation circuit 2231 will be described later with reference to FIG. 3.

When the failure test is performed based on the second test command TCMD2, the first test pattern detection circuit 225_1 may generate the first internal failure flag IFLAG1 by detecting whether the first latch data LD_1 has the preset test pattern. When the second test command TCMD2 is activated and the pattern of the first latch data LD_1 is the same as the preset test pattern, the first test pattern detection circuit 225_1 may generate the first internal failure flag IFLAG1 which has a first logic level. When the second test command TCMD2 is activated and the pattern of the first latch data LD_1 is different from the preset test pattern, the first test pattern detection circuit 225_1 may generate the first internal failure flag IFLAG1 which has a second logic level. According to an embodiment, the first logic level may be set as a logic low level, and the second logic level may be set as a logic high level. The configuration and operation of the first test pattern detection circuit 2251 will be described later with reference to FIG. 4.

The failure flag output circuit 227 may output one of a plurality of internal failure flags IFLAG as the failure flag FLAG based on the test control signal TCTR. The failure flag output circuit 227 may output one of the first, second, third and fourth internal failure flags IFLAG1, IFLAG2, IFLAG3 and IFLAG4 as the failure flag FLAG based on the first, second, third and fourth test control signals TCTR<1>, TCTR<2>, TCTR<3> and TCTR<4>. For example, when the first test control signal TCTR<1> is activated, the failure flag output circuit 227 may output the first internal failure flag IFLAG1 as the failure flag FLAG. When the second test control signal TCTR<2> is activated, the failure flag output circuit 227 may output the second internal failure flag IFLAG2 as the failure flag FLAG. The failure flag output circuit 227 may include NAND gates 227_1, 227_2, 227_3 and 227_4 and an AND gate 227_5. When the first test control signal TCTR<1> is activated to a logic high level, the NAND gate 227_1 may invert and buffer the first internal failure flag IFLAG1 and output an output signal to one of the input terminals of the AND gate 227_5. When the first test control signal TCTR<1> is inactivated to a logic low level, the NAND gate 227_1 may output a signal, which has a logic high level, to the one of the input terminals of the AND gate 227_5. Since the operation of each of the NAND gates 227_2, 227_3 and 227_4 is implemented in the same manner as the operation of the NAND gates 227_1, detailed description thereof will be omitted herein. The AND gate 227_5 may output the failure flag FLAG, which has a logic high level, when all of output signals of the NAND gates 227_1, 227_2, 227_3 and 227_4 are logic high levels. The AND gate 227_5 may output the failure flag FLAG, which has a logic low level, when at least one of output signals of the NAND gates 227_1, 227_2, 227_3 and 227_4 is a logic low level. Accordingly, the failure flag output circuit 227 may output one of the plurality of internal failure flags IFLAG as the failure flag FLAG based on the test control signal TCTR, thereby detecting a location of a defect of a latch circuit for fuse data.

Figure 3:
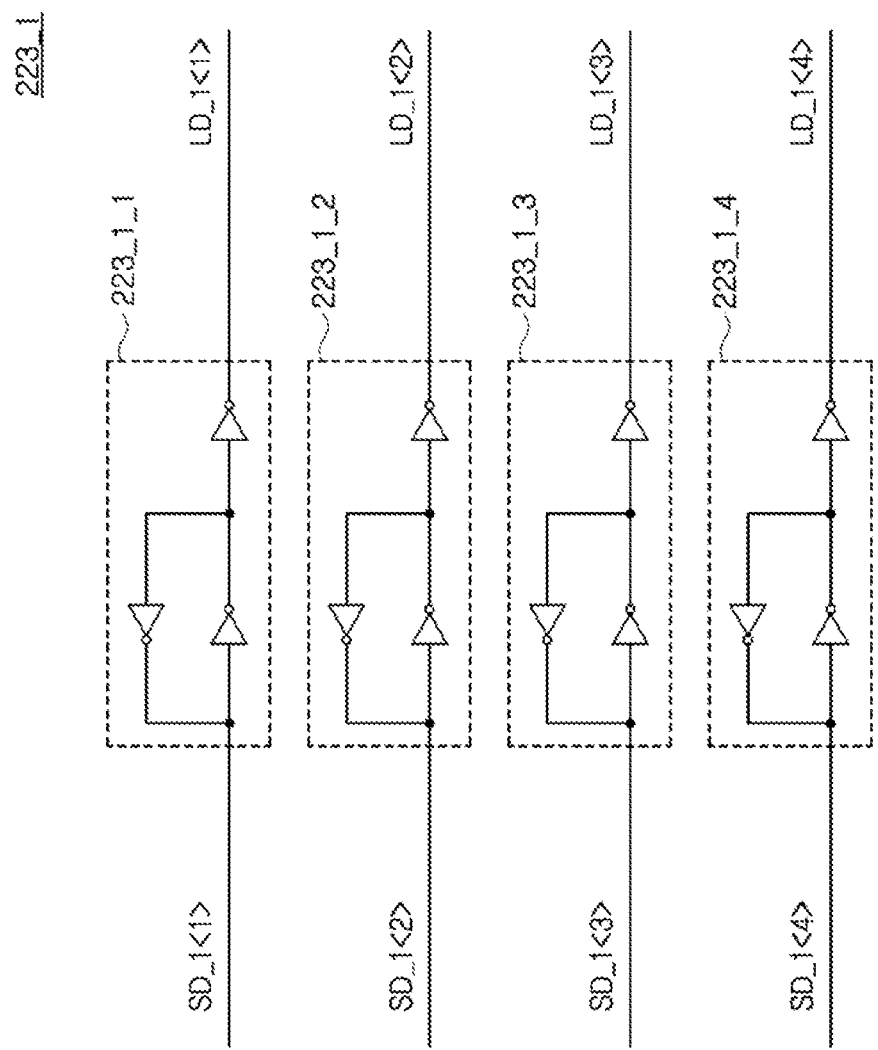
FIG. 3 is a circuit diagram illustrating an embodiment of a latch data generation circuit illustrated in FIG. 2.

FIG. 3 is a circuit diagram illustrating an embodiment of the first latch data generation circuit 223_1 illustrated in FIG. 2, As illustrated in FIG. 3, the first latch data generation circuit 223_1 may include a plurality of latch circuits 223_1_1, 223_1_2, 223_1_3 and 223_1_4. The latch circuit 223_1_1 may generate a first bit LD_1<1> of the first latch data LD_1 by latching a first bit SD_1<1> of the first selection data SD_1. The latch circuit 223_1_2 may generate a second bit LD_1<2> of the first latch data LD_1 by latching a second bit SD_1<2> of the first selection data SD_1. The latch circuit 223_1_3 may generate a third bit LD_1<3> of the first latch data LD_1 by latching a third bit SD_1<3> of the first selection data SD_1, The latch circuit 223_1_4 may generate a fourth bit LD_1<4> of the first latch data LD_1 by latching a fourth bit SD_1<4> of the first selection data SD_1.

Figure 4:
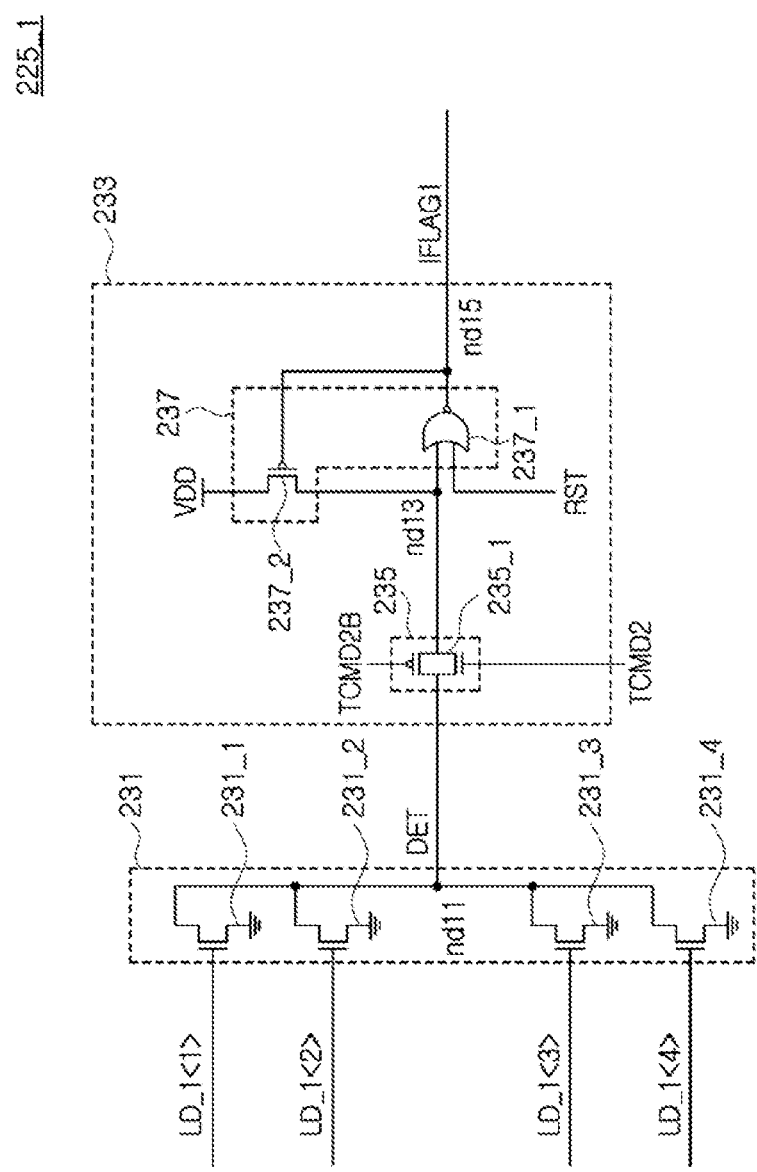
FIG. 4 is a circuit diagram illustrating an embodiment of a test pattern detection circuit illustrated in FIG. 2.

FIG. 4 is a circuit diagram illustrating an embodiment of the first test pattern detection circuit 225_1 illustrated in FIG. 2. As illustrated in FIG. 4, the first test pattern detection circuit 225_1 may include a detection signal generation circuit 231 and an internal failure flag output circuit 233.

The detection signal generation circuit 231 may include NMOS transistors 231_1, 231_2, 231_3 and 231_4, Gate terminals of the NMOS transistors 231_1, 231_2, 231_3 and 231_4 may receive the first, second, third and fourth bits LD_1<1>, LD_1<2>, LD_1<3> and LD_1<4>, respectively, of the first latch data LD_1. The detection signal generation circuit 231 may generate a detection signal DET by detecting whether the first latch data LD_1 has the preset test pattern. The preset test pattern may be set as 'L, L, L, L.' The detection signal generation circuit 231 may adjust a level of an internal node nd11 by detecting whether the first latch data LD_1 has the preset test pattern, and may generate the detection signal DET from the internal node nd11. The level of the internal node nd11 may be initialized to a logic high level when the failure test is performed. When the pattern of the first latch data LD_1 is the same as the preset test pattern, the detection signal generation circuit 231 may output the detection signal DET, which has a logic high level, to the internal node nd11. When all of the first, second, third and fourth bits LD_1<1>, LD_1<2>, LD_1<3> and LD_1<4> of the first latch data LD_1 have logic low levels, the detection signal generation circuit 231 may turn off all of the NMOS transistors 231_1, 231_2, 231_3 and 231_4. When all of the NMOS transistors 231_1, 231_2, 231_3 and 231_4 are turned off, the level of the internal node nd11 may be maintained at a logic high level. When the pattern of the first latch data is different from the preset test pattern, the detection signal generation circuit 231 may output the detection signal DET, which has a logic low level, to the internal node nd11. When at least one of the first, second, third and fourth bits ILD_1<1>, LD_1<2>, LD_1<3> and LD_1<4> of the first latch data LD_1 has a logic high level, the detection signal generation circuit 231 may adjust the level of the internal node nd11 to a logic low level. For example, when the first bit LD_1<1> of the first latch data LD_1 has a logic high level, the detection signal generation circuit 231 may turn on the NMOS transistor 231_1. When the NMOS transistor 231_1 is turned on, the detection signal generation circuit 231 may adjust the level of the internal node nd11 to a logic low level by discharging the charges of the internal node nd11.

The internal failure flag output circuit 233 may include a test command input circuit 235 and an initialization circuit 237. The internal failure flag output circuit 233 may output the first internal failure flag IFLAG1 from the detection signal DET based on the second test command TCMD2. When the second test command TCMD2 is activated, the internal failure flag output circuit 233 may invert and buffer the detection signal DET and output the first internal failure flag IFLAG1, When the second test command TCMD2 is inactivated, the internal failure flag output circuit 233 may block the input of the detection signal DET.

The test command input circuit 235 may electrically couple the internal node nd11 and an internal node nd13 based on the second test command TCMD2 and an inverted second test command TCMD2B. The inverted second test command TCMD2B may be generated by inverting the logic level of the second test command TCMD2. The test command input circuit 235 may electrically couple the internal node nd11 and the internal node nd13 when the second test command TCMD2 is activated to a logic high level. The test command input circuit 235 may be implemented by a transfer gate 235_1.

The initialization circuit 237 may initialize the levels of the internal node nd13 and an internal node nd15 based on an initialization signal RST. The initialization signal RST may be activated to a logic high level when an initialization operation is performed. When the initialization signal RST is activated, the initialization circuit 237 may initialize the internal node nd13 to a logic high level, and may initialize the internal node nd15 to a logic low level. When the initialization signal RST is inactivated, the initialization circuit 237 may invert and buffer the signal of the internal node nd13 and output the first internal failure flag IFLAG1 to the internal node nd15. The initialization circuit 237 may be implemented by a NOR gate 237_1 and a PMOS transistor 237_2, In an embodiment, the PMOS transistor 237_2 may receive voltage VDD, In an embodiment, the voltage VDD may be a power supply voltage.

Figure 5:
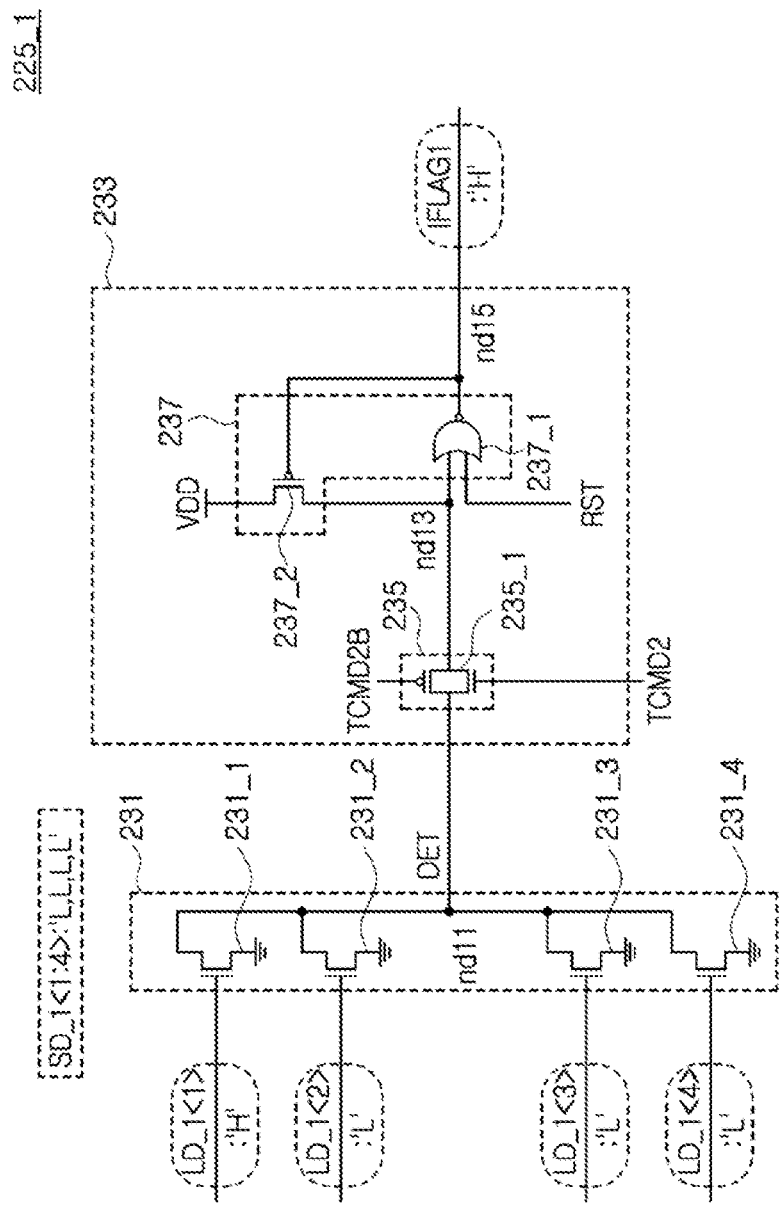
FIG. 5 is a diagram to assist in the explanation of the operation of the test pattern detection circuit included in the apparatus illustrated in FIG. 1.

FIG. 5 is a diagram to assist in the explanation of an operation of detecting a failure in the first test pattern detection circuit 225_1 (see FIG. 2) when a failure occurs in the first latch data generation circuit 223_1 (see FIG. 2) included in the apparatus 100a illustrated in FIG. 1.

Referring to FIG. 2, the first latch data generation circuit 223_1 may generate the first to fourth bits LD_1<1:4> of the first latch data LD_1 by latching the respective first to fourth bits SD_1<1:4> of the first selection data SD_1 having the preset test input pattern 'L, L, L, L.' When a failure occurs in the latch circuit 223_1_1 (see FIG. 3), the first latch data generation circuit 223_1 may generate the first to fourth bits LD_1<1:4> of the first latch data LD_1 having a pattern 'H, L, L, L' different from the preset test input pattern.

Referring to FIG. 5, the detection signal generation circuit 231 may turn on the NMOS transistor 231_1 by receiving the first bit LD_1<1> of the first latch data LD_1 having a logic high level 'H.' When the NMOS transistor 231_1 is turned on, the detection signal generation circuit 231 may adjust the level of the internal node nd11 to a logic low level by discharging the charges of the internal node nd11. When the second test command TCMD2 is activated, the internal failure flag output circuit 233 may invert and buffer the detection signal DET and output the first internal failure flag IFLAG1 which is activated to a logic high level 'H.'

Figure 6:
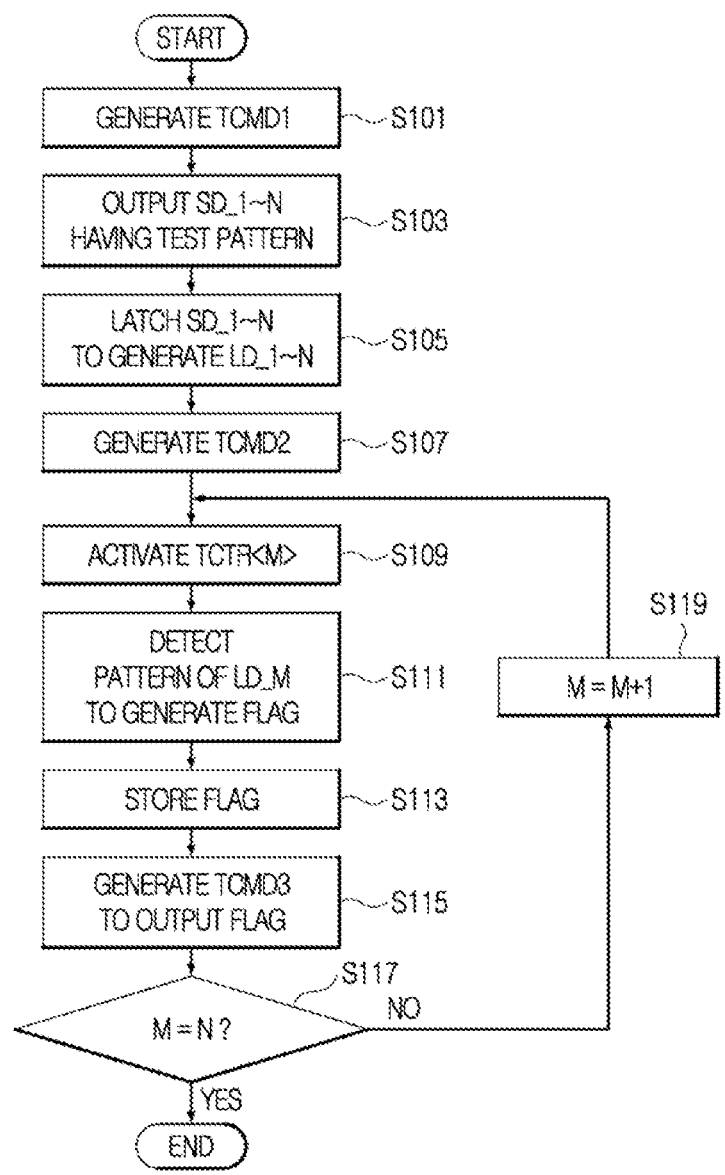
FIGS. 6 and 7 are flow charts to assist in the explanation of methods for performing a failure test in the apparatus illustrated in FIG. 1.

FIG. 6 is a flow chart to assist in the explanation of a method for performing a failure test in the apparatus 100*a* illustrated in FIG. 1, In the case where a failure test is performed according to the method suggested in FIG. 6, it may be possible to check whether each of the plurality of latch data generation circuits 223_1, 223_2, 223_3 and 223_4 (see FIG. 2) is defective.

At step S101, the command generation circuit 201 may generate the first test command TCMD1 based on the external setting code CA which has a logic level combination for entering the failure test.

At step S103, the selection data generation circuit 209*a* may output first to Nigh selection data SD_1 to SD_N having a preset test input pattern, based on the first test command TCMD1 (N may be set as a natural number of 2 or greater). As used herein, the tilde "~" indicates a range of data. For example, "SD_1~N" indicates the first to Nigh selection data SD_1 to SD_N shown in FIG. 6.

At step S105, the failure flag generation circuit 211 may generate first to N^th latch data LD_1 to LD_N (LD_1~N) by latching the first to N^thh selection data SD_1 to SD_N, respectively.

At step S107, the command generation circuit 201 may generate the second test command TCMD2 based on the external setting code CA which has a logic level combination for performing the failure test.

At step S109, the test control circuit 205*a* may activate an M^th test control signal TCTR<M> among first to N^th test control signals TCTR<1:N>, depending on a combination of the external setting code CA (M may be set to have an initial value of 1 and may be set as a natural number of N or less).

At step S111, the failure flag generation circuit 211 may generate the failure flag FLAG by detecting whether M^th latch data LD_M has the preset test pattern, based on the second test command TCMD2 and the M^th test control signal TCTR<M>.

At step S113, the failure flag storage circuit 213 may receive and store the failure flag FLAG.

At step S115, the command generation circuit 201 may generate the third test command TCMD3 based on the external setting code CA which has a logic level combination for outputting the failure flag FLAG. Accordingly, the failure flag storage circuit 213 may output the stored failure flag FLAG as data DATA through the data output line, based on the third test command TCMD3.

At step S117, whether to end the failure test may be determined by checking whether the failure test has been completely performed for the plurality of latch data generation circuits 223_1, 223_2, 223_3 and 223_4 (see FIG. 2). When the failure test has been completely performed, the failure test may be ended. Steps S119, S109, S111, S113, S115 and S117 may be repeatedly performed when the failure test has not been completely performed.

At the step S119, the test control circuit 205*a* may receive the external setting code CA which has a combination for activating an (M+1)^th test control signal TCTR<M+1>.

Figure 7:
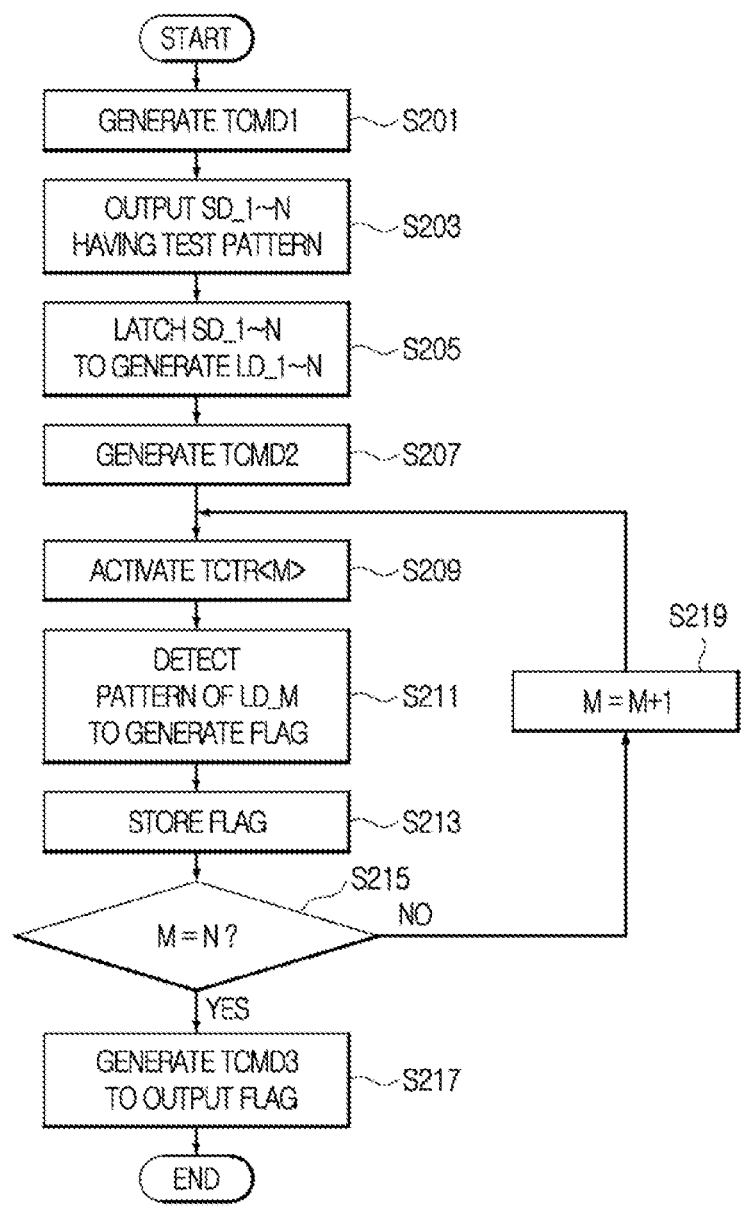

FIG. 7 is a flow chart to assist in the explanation of another method for performing a failure test in the apparatus 100*a* illustrated in FIG. 1. In the case where a failure test is performed according to the method suggested in FIG. 7, it may be possible to collectively check whether the plurality of latch data generation circuits 223_1, 223_2, 223_3 and 223_4 (see FIG. 2) are defective.

Referring to FIG. 7, steps S201, S203, S205, S207, S209, S211, S213 and S219 are performed in the same manner as the steps S101, S103, S105, S107, S109, S111, S113 and S119, respectively, illustrated in FIG. 6.

At step S215, whether to end the failure test may be determined by checking whether the failure test has been completely performed for the plurality of latch data generation circuits 223_1, 223_2, 223_3 and 223_4 (see FIG. 2). When the failure test has been completely performed, step S217 may be performed to end the failure test. The steps S219, S209, S211, S213 and S215 may be repeatedly performed when the failure test has not been completely performed.

At the step S217, the command generation circuit 201 may generate the third test command TCMD3 based on the external setting code CA which has a logic level combination for outputting the failure flag FLAG. Accordingly, the failure flag storage circuit 213 may output the stored failure flag FLAG as data DATA through the data output line, based on the third test command TCMD3.

Figure 8:
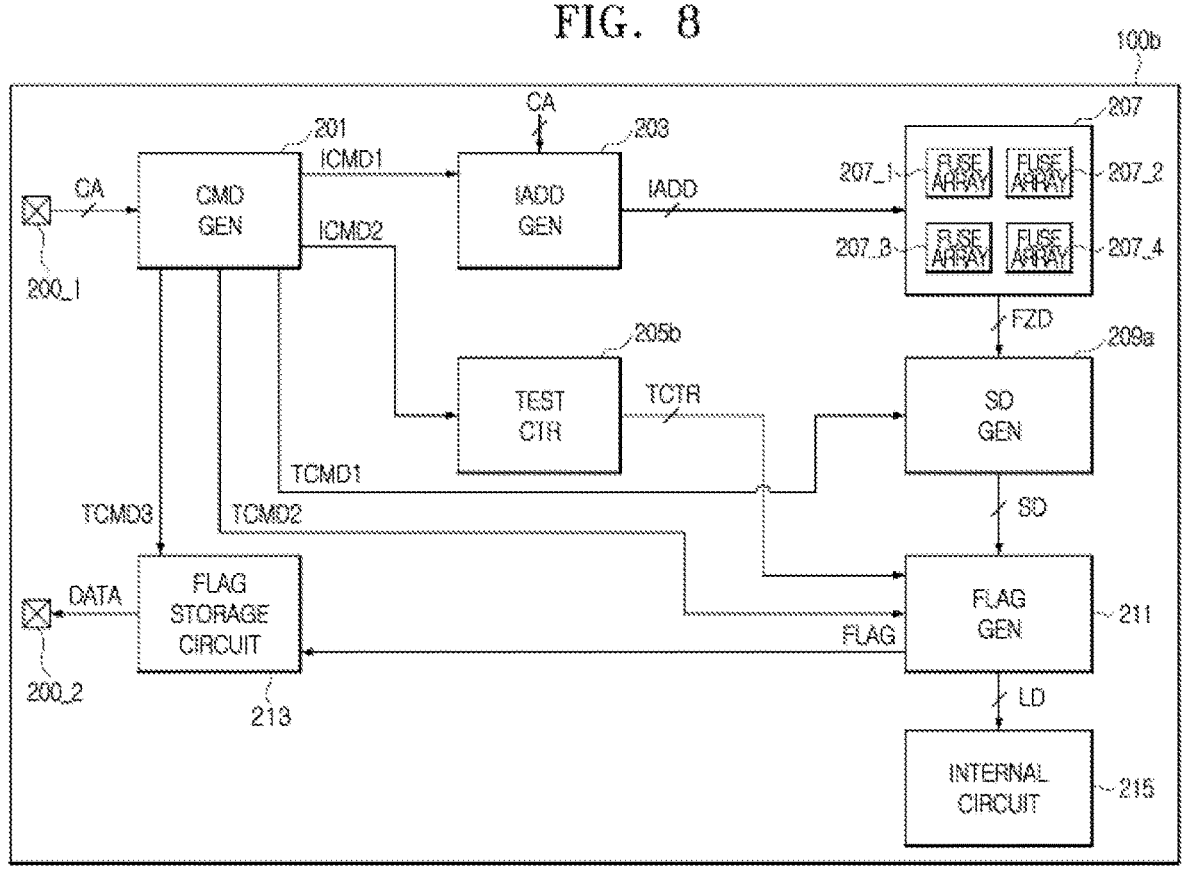
FIG. 8 is a block diagram illustrating a configuration of an apparatus in accordance with another embodiment of the present disclosure.

FIG. 8 is a block diagram illustrating a configuration of an apparatus 100*b* in accordance with another embodiment of the present disclosure. As illustrated in FIG. 8, the apparatus 100*b* may include a first pad 200_1, a second pad 200_2, a command generation circuit (CMD GEN) 201, an address generation circuit (IADD GEN) 203, a test control circuit (TEST CTR) 205*b*, a fuse data storage circuit 207, a selection data generation circuit (SD GEN) 209*a*, a failure flag generation circuit (FLAG GEN) 211, a failure flag storage circuit (FLAG STORAGE CIRCUIT) 213 and an internal circuit (INTERNAL CIRCUIT) 215. Since the first pad 200_1, the second pad 200_2, the command generation circuit 201, the address generation circuit 203, the fuse data storage circuit 207, the selection data generation circuit 209*a*, the failure flag generation circuit 211, the failure flag storage circuit 213 and the internal circuit 215 are implemented in the same manner as those, respectively, illustrated in FIG. 1, detailed description thereof will be omitted herein.

The test control circuit 205*b* may generate the test control signal TCTR based on the second internal command ICMD2. The test control circuit 205*b* may sequentially activate the test control signal TCTR when the second internal command ICMD2 is activated. For example, when the second internal command ICMD2 is activated, the test control circuit 205*b* may sequentially activate the first test control signal TCTR<1> (see FIG. 2) and the second test control signal TCTR<2> (see FIG. 2). The test control signal TCTR may be generated to control the output of the failure flag FLAG in the failure flag generation circuit 211. For example, the first test control signal TCTR<1> (see FIG. 2) may be activated to output the first internal failure flag IFLAG1 (see FIG. 2) as the failure flag FLAG (see FIG. 2), The second test control signal TCTR<2> (see FIG. 2) may be activated to output the second internal failure flag IFLAG2 (see FIG. 2) as the failure flag FLAG (see FIG. 2).

The detailed configuration and operation of the test control circuit 205b will be described below with reference to FIG. 9.

Figure 9:
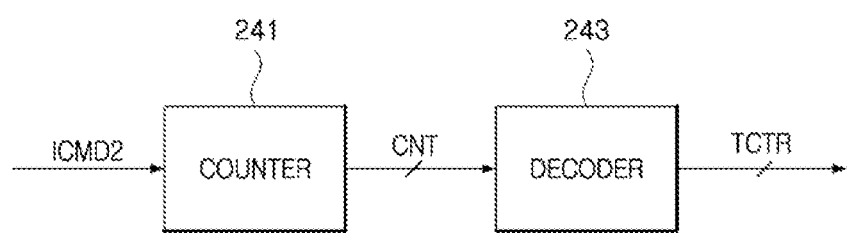
FIG. 9 is a block diagram illustrating a configuration of an embodiment of a test control circuit illustrated in FIG. 8.

FIG. 9 is a block diagram illustrating a configuration of an embodiment of the test control circuit 205b illustrated in FIG. 8. As illustrated in FIG. 9, the test control circuit 205b may include a count circuit (COUNTER) 241 and a decoder (DECODER) 243.

The count circuit 241 may sequentially transition a logic level combination of a count signal CNT when the second internal command ICMD2 is activated. For example, the count circuit 241 may transition a logic level combination 'H, H' of the count signal CNT to a logic level combination 'L, L' when the second internal command ICMD2 is activated. Thereafter, the count circuit 241 may transition the logic level combination 'L, L' of the count signal CNT to a logic level combination 'L, H.'

The decoder 243 may generate the test control signal TCTR by decoding the count signal CNT. For example, when the count signal CNT has the logic level combination 'L, L,' the decoder 243 may activate the first test control signal TCTR<1>. When the count signal CNT has the logic level combination 'L, H,' the decoder 243 may activate the second test control signal TCTR<2>.

Figure 10:
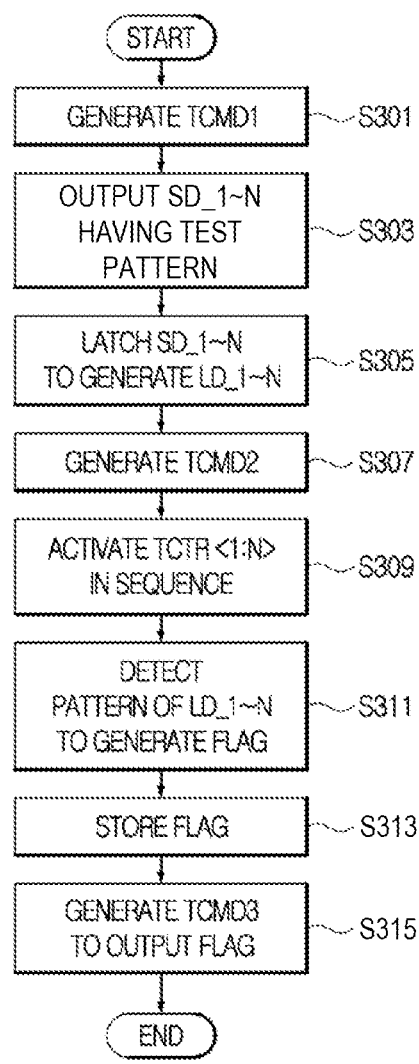
FIG. 10 is a flow chart to assist in the explanation of a method for performing a failure test in the apparatus illustrated in FIG. 8.

FIG. 10 is a flow chart to assist in the explanation of a method for performing a failure test in the apparatus 100b illustrated in FIG. 8. In the case where a failure test is performed according to the method suggested in FIG. 10, it may be possible to shorten a test time for checking whether the plurality of latch data generation circuits 223_1, 223_2, 223_3 and 223_4 (see FIG. 2) are defective.

Referring to FIG. 10, steps S301, S303, S305 and S307 are performed in the same manner as the steps S101, S103, S105 and S107 illustrated in FIG. 6.

At step S309, the test control circuit 205b may sequentially activate the first to N^th test control signals TCTR<1:N> when the second internal command ICMD2 is activated.

At step S311, the failure flag generation circuit 211 may generate the failure flag FLAG by detecting whether the first to N^th latch data LD_1 to LD_N have the preset test pattern, based on the second test command TCMD2 and the first to N^th test control signals TCTR<1:N>.

At step S313, the failure flag storage circuit 213 may receive and store the failure flag FLAG.

At step S315, the command generation circuit 201 may generate the third test command TCMD3 based on the external setting code CA which has a logic level combination for outputting the failure flag FLAG. Accordingly, the failure flag storage circuit 213 may output the stored failure flag FLAG as data DATA through the data output line, based on the third test command TCMD3.

Figure 11:
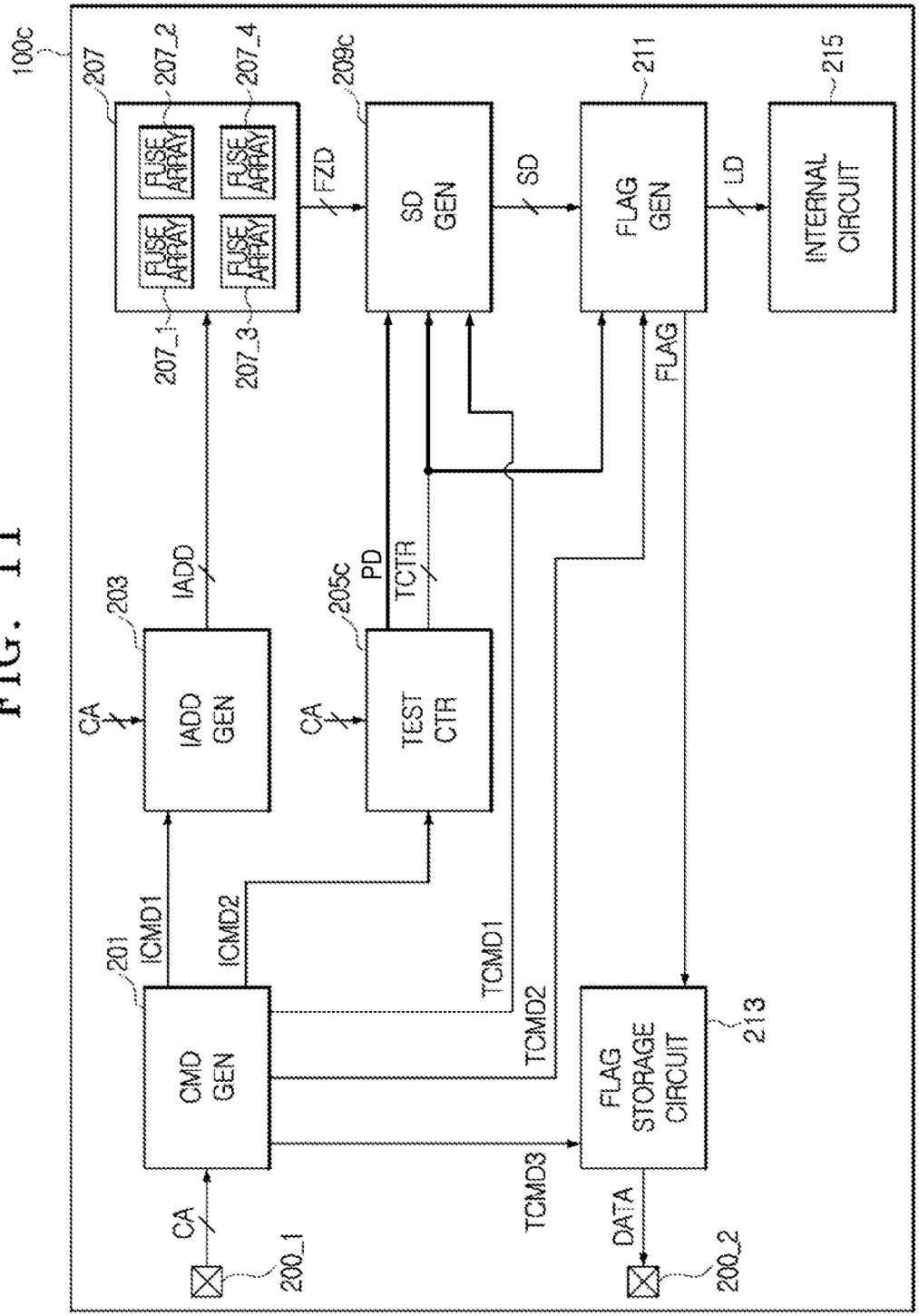
FIG. 11 is a block diagram illustrating a configuration of an apparatus in accordance with still another embodiment of the present disclosure.

FIG. 11 is a block diagram illustrating a configuration of an apparatus 100c in accordance with still another embodiment of the present disclosure. As illustrated in FIG. 11, the apparatus 100c may include a first pad 200_1, a second pad 200_2, a command generation circuit (CMD GEN) 201, an address generation circuit (IADD GEN) 203, a test control circuit (TEST CTR) 205c, a fuse data storage circuit 207, a selection data generation circuit (SD GEN) 209c, a failure flag generation circuit (FLAG GEN) 211, a failure flag storage circuit (FLAG STORAGE CIRCUIT) 213 and an internal circuit (INTERNAL CIRCUIT) 215. Since the first pad 200_1, the second pad 200_2, the command generation circuit 201, the address generation circuit 203, the fuse data storage circuit 207, the failure flag generation circuit 211, the failure flag storage circuit 213 and the internal circuit 215 are implemented in the same manner as those, respectively, illustrated in FIG. 1, detailed description thereof will be omitted herein.

The test control circuit 205c may generate pattern data PD and the test control signal TCTR from the external setting code CA based on the second internal command ICMD2. The test control circuit 205c may generate the pattern data PD by extracting the external setting code CA when the second internal command ICMD2 is activated. The pattern data PD may have one of first and second test input patterns. The first test input pattern may be set as bits which are the same as bits of a test pattern preset in the failure flag generation circuit 211. For example, the first test input pattern may be set as 'L, L, L, L' when the preset test pattern is set as 'L, L, L, L.' The second test input pattern may be set as bits of which one bit is different from one bit of bits of the preset test pattern. For example, the second test input pattern may be set as 'H, L, L, L.' when the preset test pattern is set as 'L, L, L, L.' When the second internal command ICMD2 is activated, the test control circuit 205c may selectively activate the test control signal TCTR depending on a combination of the external setting code CA. For example, when the second internal command ICMD2 is activated, the test control circuit 205c may activate the first test control signal TCTR<1> (see FIG. 2) corresponding to a first combination of the external setting code CA. When the second internal command ICMD2 is activated, the test control circuit 205c may activate the second test control signal TCTR<2> (see FIG. 2) corresponding to a second combination of the external setting code CA. The test control signal TCTR may be generated to select an output path of the pattern data PD in the selection data generation circuit 209c when the failure test is entered. For example, when the failure test is entered, the first test control signal TCTR<1> may be activated to output the pattern data PD as the first selection data SD_1. When the failure test is entered, the second test control signal TCTR<2> may be activated to output the pattern data PD as the second selection data SD_2. Also, the test control signal TCTR may be generated to control the output of the failure flag FLAG in the failure flag generation circuit 211 when the failure test is performed. For example, when the failure test is performed, the first test control signal TCTR<1> (see FIG. 2) may be activated to output the first internal failure flag IFLAG1 (see FIG. 2) as the failure flag FLAG (see FIG. 2). When the failure test is performed, the second test control signal TCTR<2> (see FIG. 2) may be activated to output the second internal failure flag IFLAG2 (see FIG. 2) as the failure flag FLAG (see FIG. 2).

The selection data generation circuit 209c may generate the selection data SD based on the first test command TCMD1, the test control signal TCTR, the fuse data FZD and the pattern data PD. The selection data generation circuit 209c may output one of the fuse data FZD and the pattern data PD as the selection data SD depending on whether the failure test is entered. When the first test command TCMD1 is inactivated, the selection data generation circuit 209c may output the fuse data FZD as the selection data SD. For example, when the first test command TCMD1 is inactivated, the selection data generation circuit 209c may output the first fuse data FZD_1 as the first selection data SD_1. When the first test command TCMD1 is inactivated, the selection data generation circuit 209c may output the second fuse data FZD_2 as the second selection data SD_2, When the failure test is entered based on the activated first test command TCMD1 and the test control signal TCTR, the selection data generation circuit 209c may output the pattern data PD as the selection data SD. For example, when the failure test is entered, the selection data generation circuit 209c may output the pattern data PD as the first selection data SD_1 based on the activated first test control signal TCTR<1>. When the failure test is entered, the selection data generation circuit 209c may output the pattern data PD as the second selection data SD_2 based on the activated second test control signal TCTR<2>.

Figure 12:
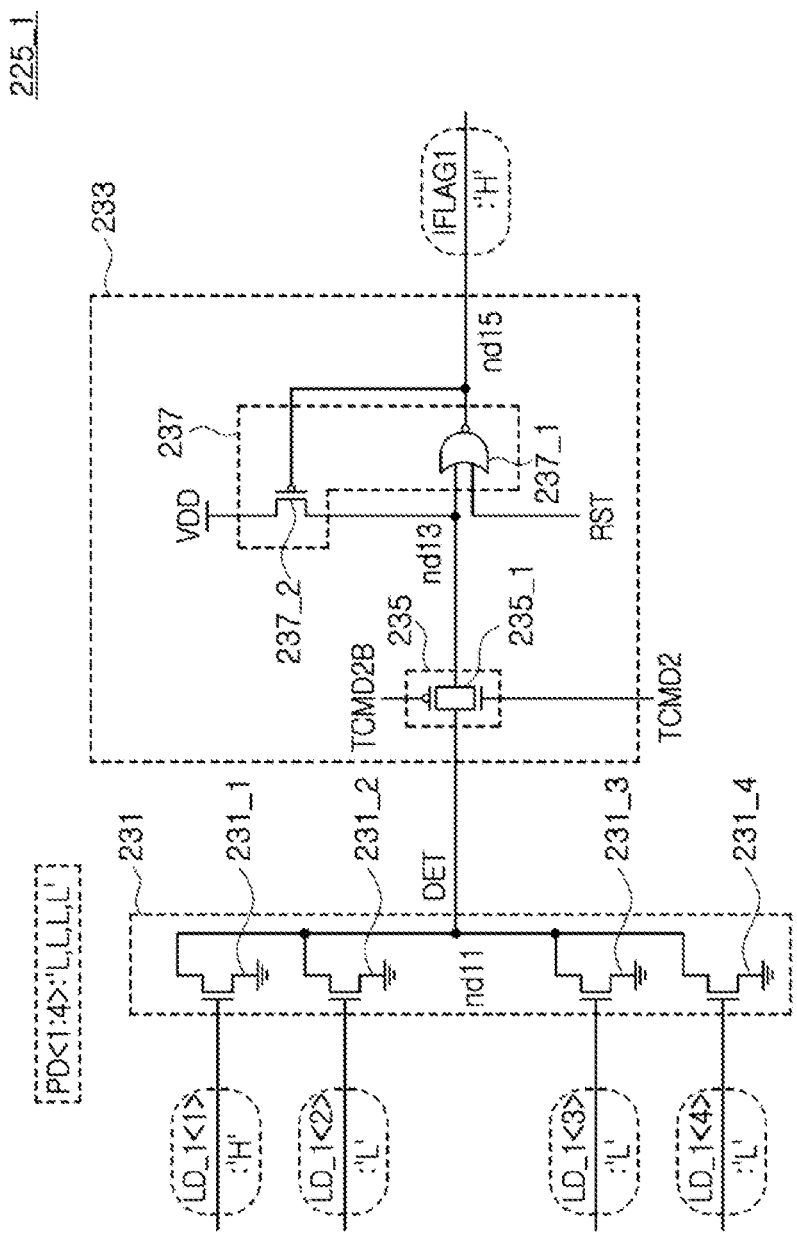
FIGS. 12 and 13 are diagrams to assist in the explanation of the operation of a test pattern detection circuit included in the apparatus illustrated in FIG. 11.
Figure 13:
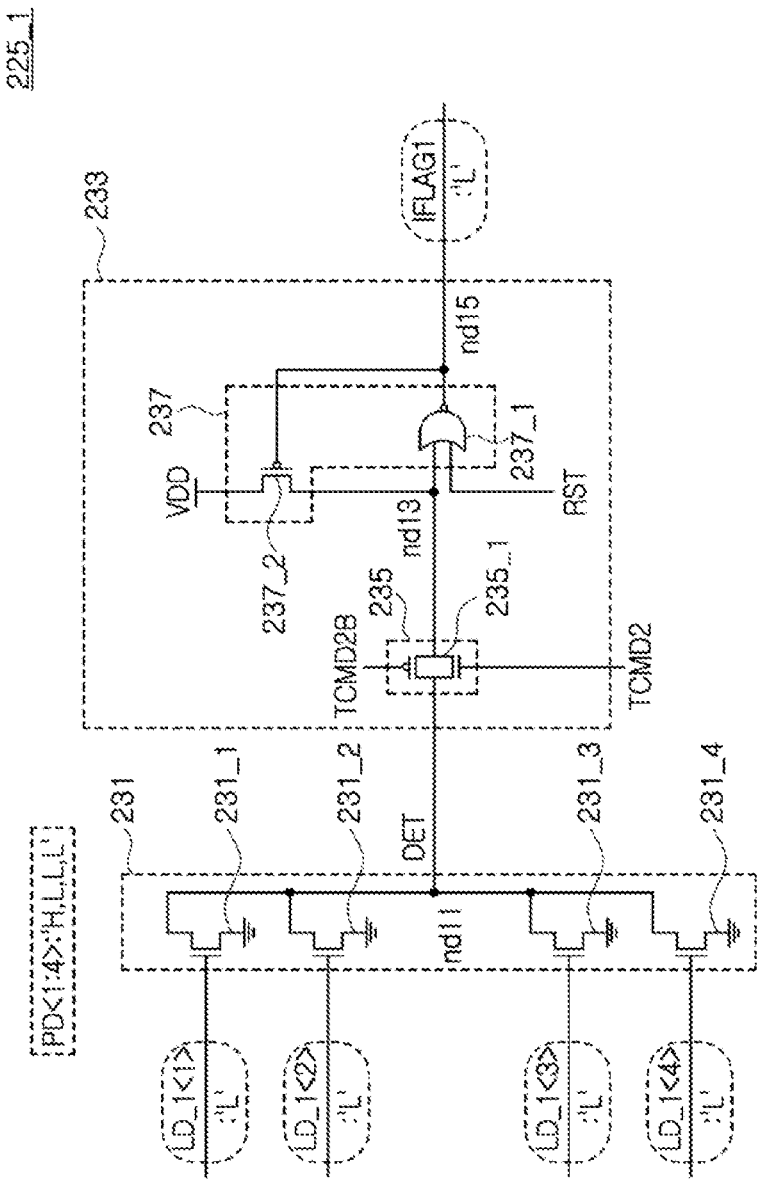

FIGS. 12 and 13 are diagrams to assist in the explanation of an operation of detecting a failure in the first test pattern detection circuit 225_1 (see FIG. 2) when a failure occurs in the first latch data generation circuit 223_1 (see FIG. 2) included in the apparatus 100c illustrated in FIG. 11.

FIG. 12 is a diagram to assist in the explanation of an operation of detecting a failure in the first test pattern detection circuit 225_1 (see FIG. 2) when the test control circuit 205c illustrated in FIG. 11 generates the pattern data PD having the first test input pattern.

Referring to FIG. 11, the test control circuit 205c may generate first to fourth bits PD<1:4> of the pattern data PD having the first test input pattern 'L, L, L, L,' by extracting the external setting code CA. The selection data generation circuit 209c may output the first to fourth bits PD<1:4> of the pattern data PD as the first to fourth bits SD 1<1:4> of the first selection data SD_1.

Referring to FIG. 2, the first latch data generation circuit 223_1 may generate the first to fourth bits LD_1<1:4> of the first latch data LD_1 by latching the respective first to fourth bits SD_1<1:4> of the first selection data SD_1 having the first test input pattern 'L, L, L, L.' When a failure occurs in the latch circuit 223_1_1 (see FIG. 3), the first latch data generation circuit 223_1 may generate the first to fourth bits LD_1<1:4> of the first latch data LD_1 having a pattern 'H, L, L, L.' different from the first test input pattern.

Referring to FIG. 12, the detection signal generation circuit 231 may turn on the NMOS transistor 231_1 by receiving the first bit LD_1<1> of the first latch data LD_1 having a logic high level 'H.' When the NMOS transistor 231_1 is turned on, the detection signal generation circuit 231 may adjust the level of the internal node nd11 to a logic low level by discharging the charges of the internal node nd11. When the second test command TCMD2 is activated, the internal failure flag output circuit 233 may invert and buffer the detection signal DET and output the first internal failure flag IFLAG1 which has a logic high level 'H.'

Accordingly, the apparatus 100c illustrated in FIG. 11 may check whether the first latch data generation circuit 223_1 is defective, by generating the pattern data PD having the first test input pattern.

FIG. 13 is a diagram to assist in the explanation of an operation of detecting a failure in the first test pattern detection circuit 225_1 (see FIG. 2) when the test control circuit 205c illustrated in FIG. 11 generates the pattern data PD having the second test input pattern.

Referring to FIG. 11, the test control circuit 205c may generate the first to fourth bits PD<1:4> of the pattern data PD having the second test input pattern 'H, L, L, L,' by extracting the external setting code CA. The selection data generation circuit 209c may output the first to fourth bits PD<1:4> of the pattern data PD as the first to fourth bits SD_1<1:4> of the first selection data SD_1.

Referring to FIG. 2, the first latch data generation circuit 223_1 may generate the first to fourth bits LD_1<1:4> of the first latch data LD_1 by latching the respective first to fourth bits SD_1<1:4> of the first selection data SD_1 having the second test input pattern 'H, L, L, L.' When a failure occurs in the latch circuit 223_1_1 (see FIG. 3), the first latch data generation circuit 223_1 may generate the first to fourth bits LD_1<1:4> of the first latch data LD_1 having a pattern 'L, L, L, L' different from the second test input pattern.

Referring to FIG. 13, the detection signal generation circuit 231 may turn off all of the NMOS transistors 231_1, 231_2, 231_3 and 231_4 by receiving the first to fourth bits LD_1<1:4> of the first latch data LD_1 having logic low levels 'L' When all of the NMOS transistors 231_1, 231_2, 231_3 and 231_4 are turned off, the detection signal generation circuit 231 may maintain the level of the internal node nd11 at a logic high level. The internal failure flag output circuit 233 may invert and buffer the detection signal DET based on the second test command TCMD2 and output the first internal failure flag IFLAG1 which has a logic low level 'L.'

Accordingly, the apparatus 100c illustrated in FIG. 11 may check whether each of the plurality of latch circuits 223_1_2, 223_1_3 and 223_1_4 included in the first latch data generation circuit 223_1 is defective, by generating the pattern data PD having the second test input pattern.

Figure 14:
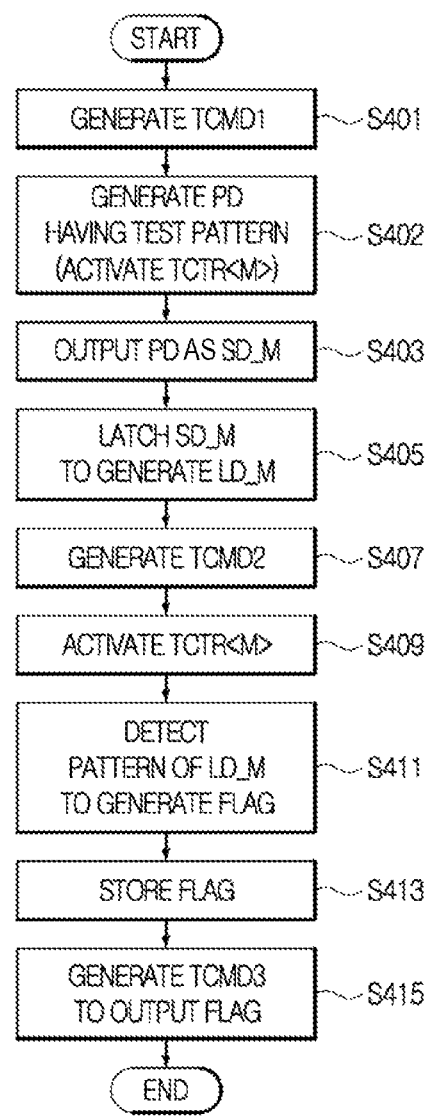
FIG. 14 is a flow chart to assist in the explanation of a method for performing a failure test in the apparatus illustrated in FIG. 11.

FIG. 14 is a flow chart to assist in the explanation of a method for performing a failure test in the apparatus 100c illustrated in FIG. 11.

At step S401, the command generation circuit 201 may generate the first test command TCMD1 based on the external setting code CA which has a logic level combination for entering the failure test.

At step S402, the test control circuit 205c may generate the pattern data PD having one of the first and second test input patterns, based on the external setting code CA, and may activate the M^th test control signal TCTR<M>.

At step S403, the selection data generation circuit 209c may output the pattern data PD as the M^th selection data SD_M based on the first test command TCMD1 and the M^th test control signal TCTR<M>.

At step S405, the failure flag generation circuit 211 may generate the M^th latch data LD_M by latching the M^th selection data SD_M.

At step S407, the command generation circuit 201 may generate the second test command TCMD2 based on the external setting code CA which has a logic level combination for performing the failure test.

At step S409, the test control circuit 205c may activate the M^th test control signal TCTR<M> among the first to N^th test control signals TCTR<1:N>, depending on a combination of the external setting code CA.

At step S411, the failure flag generation circuit 211 may generate the failure flag FLAG by detecting whether the M^th latch data LD_M has the preset test pattern, based on the second test command TCMD2 and the M^th test control signal TCTR<M>.

At step S413, the failure flag storage circuit 213 may receive and store the failure flag FLAG.

At step S415, the command generation circuit 201 may generate the third test command TCMD3 based on the external setting code CA which has a logic level combination for outputting the failure flag FLAG. Accordingly, the failure flag storage circuit 213 may output the stored failure flag FLAG as data DATA through the data output line, based on the third test command TCMD3.

As is apparent from the above description, when a failure test is performed, the present disclosure may apply and store pattern data having a test input pattern to and in a latch circuit for fuse data, and may detect whether some pattern data of the stored pattern data has a preset pattern, thereby detecting whether the latch circuit for fuse data is defective and a location of a defect.

Figure 15:
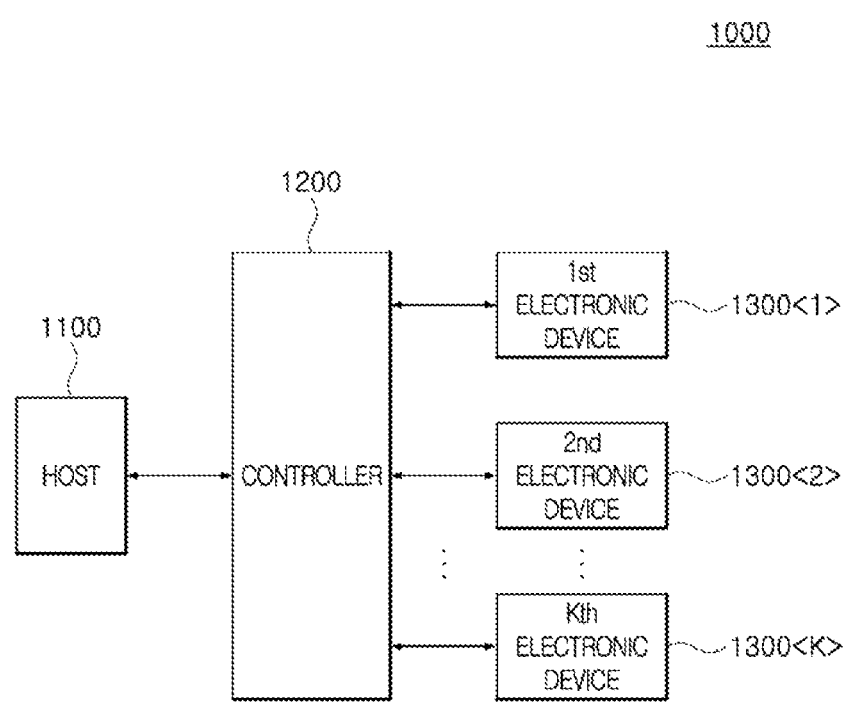
FIG. 15 is a block diagram illustrating a configuration of an embodiment of a system to which the present disclosure is applied.

FIG. 15 is a block diagram illustrating a configuration of an embodiment of a system 1000 to which the present disclosure is applied. As illustrated in FIG. 15, the electronic system 1000 may include a host (HOST) 1100, a controller (CONTROLLER) 1200 and electronic devices (ELECTRONIC DEVICES) 1300<1:K>. The electronic devices 1300<1:K> may be implemented by one of the apparatus 100a illustrated in FIG. 1, the apparatus 100b illustrated in FIG. 8 and the apparatus 100c illustrated in FIG. 11. In an embodiment, K may be an integer greater than 1.

The host 1100 and the controller 1200 may transmit signals to each other by using an interface protocol. Examples of the interface protocol used between the host 1100 and the controller 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus).

The controller 1200 may control the electronic devices 1300<1:K> so that each of the electronic devices 1300<1:K> performs various internal operations including a boot-up operation, a mode register write operation and a failure test.

According to an embodiment, the electronic devices 1300<1:K> may be implemented by a DRAM (dynamic random access memory), a PRAM (phase change random access memory), an RRAM (resistive random access memory), an MRAM (magnetic random access memory) and an FRAM (ferroelectric random access memory).

While various embodiments have been described above, it will be understood to those skilled in the art that the embodiments described are by way of example only. Accordingly, the apparatus performing a test operation described herein should not be limited based on the described embodiments.

What is claimed is:

1. An apparatus comprising:
   a selection data generation circuit configured to generate selection data from fuse data or pattern data having a preset test input pattern, depending on whether a failure test is entered, wherein the pattern data is output from the selection data generation circuit having the preset test input pattern where at least two bits of the pattern have different values; and
   a failure flag generation circuit configured to generate latch data by latching the selection data, and generate a failure flag by detecting whether the latch data has a preset test pattern, wherein the failure flag generation circuit comprises:
      a first internal failure flag generation circuit configured to generate first latch data by latching first selection data, and generate a first internal failure flag by detecting whether the first latch data has the preset test pattern;
      a second internal failure flag generation circuit configured to generate second latch data by latching second selection data, and generate a second internal failure flag by detecting whether the second latch data has the preset test pattern; and
      a failure flag output circuit configured to output one of the first and second internal failure flags as the failure flag based on first and second test control signals.

2. The apparatus according to claim 1,
   wherein the selection data generation circuit outputs the stored pattern data as the selection data when the failure test is entered, and the preset test input pattern is set as the same bits as bits of the preset test pattern.

3. The apparatus according to claim 1,
   wherein the selection data generation circuit outputs the selection data by receiving the fuse data from a fuse array when a test command for entering the failure test is inactivated.

4. The apparatus according to claim 1,
   wherein the first internal failure flag generation circuit activates the first internal failure flag when a pattern of the first latch data is the same as the preset test pattern.

5. The apparatus according to claim 1,
   wherein the failure flag output circuit outputs the first internal failure flag as the failure flag when the first test control signal is activated, and outputs the second internal failure flag as the failure flag when the second test control signal is activated.

6. The apparatus according to claim 1, further comprising:
   a test control circuit configured to activate one of the first and second test control signals depending on a combination of an external setting code when the failure test is performed.

7. The apparatus according to claim 1, further comprising:
   a test control circuit configured to sequentially activate the first and second test control signals when the failure test is performed.

8. An apparatus comprising:
   a selection data generation circuit configured to generate selection data from fuse data or pattern data having one of first and second test input patterns, depending on whether a failure test is entered, wherein the pattern data is output from the selection data generation circuit having a preset test input pattern where at least two bits of the pattern have different values; an
   a failure flag generation circuit configured to generate latch data by latching the selection data, and generate a failure flag by detecting whether the latch data has a preset test pattern, wherein the failure flag generation circuit comprises:
      a first internal failure flag generation circuit configured to generate first latch data by latching first selection data, and generate a first internal failure flag by detecting whether the first latch data has the preset test pattern;
      a second internal failure flag generation circuit configured to generate second latch data by latching second selection data, and generate a second internal failure flag by detecting whether the second latch data has the preset test pattern; and
      a failure flag output circuit configured to output one of the first and second internal failure flags as the failure flag based on first and second test control signals.

9. The apparatus according to claim 8, further comprising:
   a test control circuit configured to generate the pattern data having one of the first and second test input patterns, by extracting an external setting code when the failure test is entered, the first test input pattern being set as the same bits as bits of the preset test pattern and the second test input pattern being set as bits of which at least one bit is different from corresponding bits of the preset test pattern.

10. The apparatus according to claim 8,
    wherein the selection data generation circuit outputs the pattern data as one of the first and second selection data based on the first and second test control signals when the failure test is entered, and the first and second test control signals are selectively activated depending on a combination of an external setting code.

11. The apparatus according to claim 8,
wherein the first internal failure flag generation circuit generates the first internal failure flag having a first logic level when a pattern of the first latch data is the same as the preset test pattern, and generates the first internal failure flag having a second logic level when a pattern of the first latch data is different from the preset test pattern.

12. The apparatus according to claim 8,
wherein the failure flag output circuit outputs the first internal failure flag as the failure flag when the first test control signal is activated, and outputs the second internal failure flag as the failure flag when the second test control signal is activated.

13. The apparatus according to claim 8, further comprising:
a test control circuit configured to activate one of the first and second test control signals depending on a combination of an external setting code when the failure test is performed.

\* \* \* \* \*